(12) United States Patent
Sasaki et al.

(10) Patent No.: US 12,033,886 B2
(45) Date of Patent: Jul. 9, 2024

(54) PLASMA PROCESSING APPARATUS AND METHOD FOR MANUFACTURING MOUNTING STAGE

(71) Applicant: Tokyo Electron Limited, Tokyo (JP)

(72) Inventors: Yasuharu Sasaki, Miyagi (JP); Ryo Chiba, Miyagi (JP); Akira Nagayama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 97 days.

(21) Appl. No.: 16/282,552

(22) Filed: Feb. 22, 2019

(65) Prior Publication Data

US 2019/0267277 A1 Aug. 29, 2019

(30) Foreign Application Priority Data

Feb. 26, 2018 (JP) ................. 2018-032364

(51) Int. Cl.
*H01L 21/687* (2006.01)
*H01J 37/32* (2006.01)
*H01L 21/67* (2006.01)
*H01L 21/683* (2006.01)

(52) U.S. Cl.
CPC .. *H01L 21/68785* (2013.01); *H01J 37/32724* (2013.01); *H01L 21/67109* (2013.01); *H01L 21/6831* (2013.01); *H01J 2237/3343* (2013.01)

(58) Field of Classification Search
CPC ......... H01L 21/68785; H01L 21/67109; H01L 21/6831; H01L 21/6833; H01J 37/32724; H01J 2237/3343; C23C 16/4586

USPC .................................................. 118/715–733
See application file for complete search history.

(56) References Cited

U.S. PATENT DOCUMENTS

| 5,625,526 A * | 4/1997 | Watanabe ........... G03F 7/70708 |
| | | 361/234 |
| 5,730,803 A * | 3/1998 | Steger ................. C23C 16/4586 |
| | | 118/724 |
| 10,896,837 B2 * | 1/2021 | Pilgrim ............. H01L 21/68757 |
| 2002/0135969 A1 * | 9/2002 | Weldon ................. H01J 37/321 |
| | | 361/234 |

(Continued)

FOREIGN PATENT DOCUMENTS

JP 2000-195935 7/2000
JP 2006-344766 12/2006

*Primary Examiner* — Charlee J. C. Bennett
(74) *Attorney, Agent, or Firm* — IPUSA, PLLC

(57) ABSTRACT

A plasma processing apparatus includes a mounting stage including a mounting surface, on which an object to be processed is mounted, a back surface provided on a side opposite to the mounting surface, a plate-like member, in which a first hole penetrating through the mounting surface and the back surface is formed, and a base having a supporting surface for supporting the plate-like member and having a second hole communicating with the first hole; and an embedment member disposed inside the first and second holes, the first embedment member being disposed inside the first hole, the second embedment member being disposed inside the second hole, wherein the first embedment member and the second embedment member are not mutually fixed, and the first embedment member has a portion having a wider width than a width of an upper end portion on a lower side than the upper end portion.

19 Claims, 6 Drawing Sheets

(56) References Cited

U.S. PATENT DOCUMENTS

| | | | |
|---|---|---|---|
| 2009/0086400 A1* | 4/2009 | Samir | H01L 21/6833 |
| | | | 361/234 |
| 2014/0202382 A1* | 7/2014 | Kim | H01L 21/68742 |
| | | | 118/500 |
| 2014/0202635 A1* | 7/2014 | Yamaguchi | H01L 21/6831 |
| | | | 279/128 |
| 2015/0090692 A1* | 4/2015 | Sasaki | C23C 16/505 |
| | | | 156/345.29 |
| 2017/0352568 A1* | 12/2017 | Cho | H01L 21/6831 |
| 2018/0158711 A1* | 6/2018 | Sasaki | H01L 21/68757 |
| 2018/0240688 A1* | 8/2018 | Hao | H01J 37/32623 |
| 2020/0013595 A1* | 1/2020 | Lee | H01J 37/32715 |
| 2020/0335384 A1* | 10/2020 | Chiba | H01L 21/68742 |

\* cited by examiner

FIG.3
Prior Art
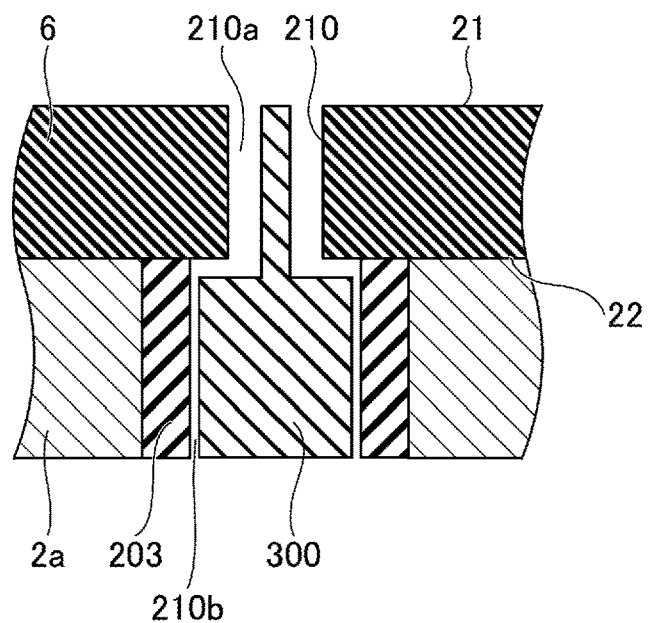
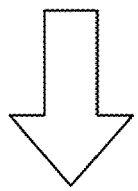
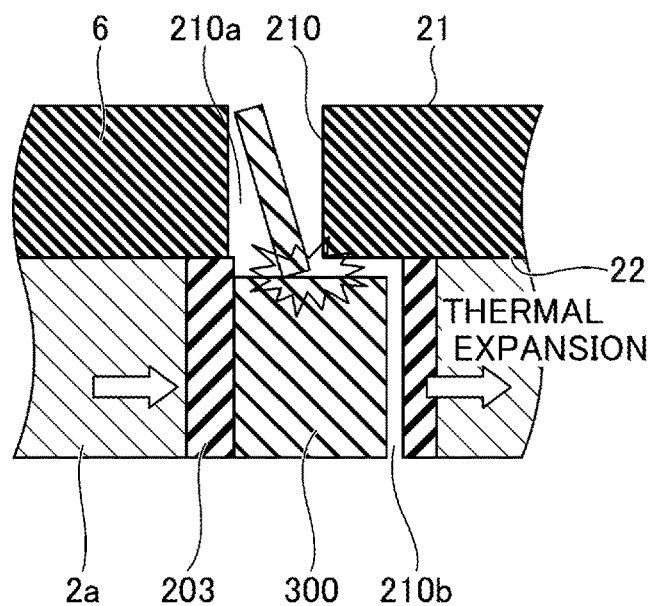

FIG.4
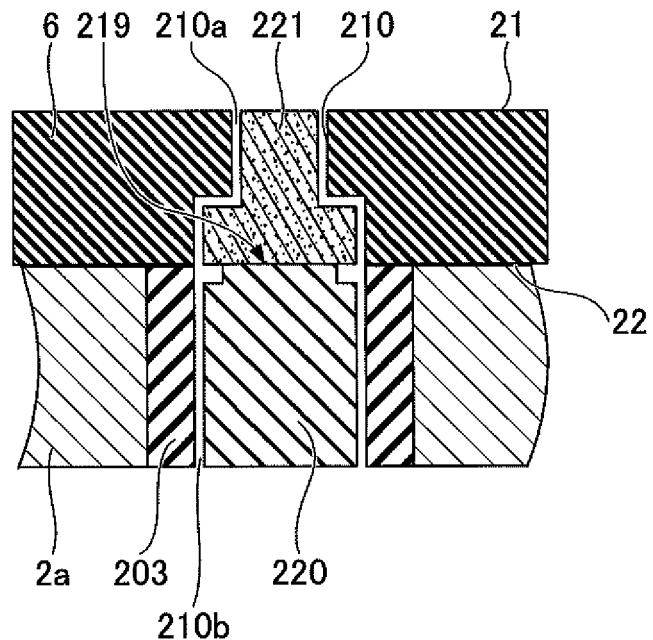
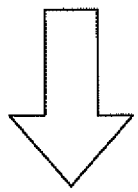
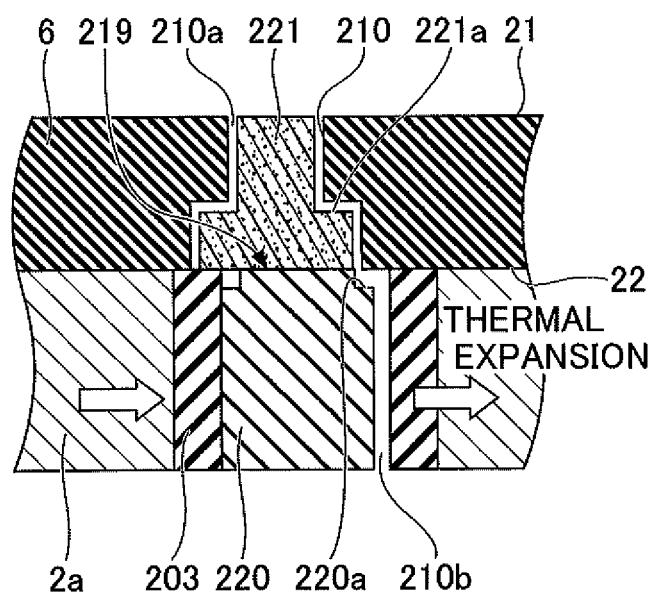

PLASMA PROCESSING APPARATUS AND METHOD FOR MANUFACTURING MOUNTING STAGE

CROSS-REFERENCE TO RELATED APPLICATIONS

This patent application is based upon and claims priority to Japanese Patent Application No. 2018-032364 filed on Feb. 26, 2018, the entire contents of which are incorporated herein by reference.

BACKGROUND OF THE INVENTION

1. Field of the Invention

The present invention relates to a plasma processing apparatus and a method for manufacturing a mounting stage.

2. Description of the Related Art

A plasma processing apparatus which performs an etching process for an object to be processed such as a wafer using plasma is conventionally known (see, for example, Patent Document 1). For example, this plasma processing apparatus includes a processing container for forming a vacuum space, in which a mounting stage for holding the object to be processed and functioning also as an electrode is accommodated. A hole (a through hole) for supplying a heat transfer gas between a back surface of an object to be processed placed on the mounting stage and an upper surface of the mounting stage is formed in the mounting stage.
[Patent Document 1] Japanese Laid-open Patent Publication No. 2000-195935

SUMMARY OF THE INVENTION

A plasma processing apparatus includes a mounting stage including a mounting surface, on which an object to be processed is mounted, a back surface provided on a side opposite to the mounting surface, a plate-like member, in which a first hole penetrating through the mounting surface and the back surface is formed, and a base having a supporting surface for supporting the plate-like member and having a second hole communicating with the first hole; and an embedment member disposed inside the first hole and the second hole, the first embedment member being disposed inside the first hole, the second embedment member being disposed inside the second hole, wherein the first embedment member and the second embedment member are not mutually fixed, and wherein the first embedment member has a portion having a wider width than a width of an upper end portion on a lower side than the upper end portion.

BRIEF DESCRIPTION OF THE DRAWINGS

FIG. 3 illustrates an example of breakage of an embedment member in a comparative example.
FIG. 4 illustrates an example of an embedment member according to the embodiment of the present invention.

DETAILED DESCRIPTION OF EMBODIMENTS

Recently, the high-frequency power applied to the mounting stages in plasma processing apparatuses has higher voltages in order to perform plasma processes. In a case where this high-frequency power applied to the mounting stages has higher voltages, the energy of the high-frequency power may concentrate on the hole supplying the heat transfer gas to occasionally cause abnormal electrical discharge. When the abnormal electrical discharge occurs in the hole supplying the heat transfer gas, there is a risk that the quality of the object to be processed processed by the plasma processing apparatus is degraded and a drop of yield occurs.

An object of the present invention is to provide an embedment member that prevents abnormal electrical discharge in a hole for communicating a heat transfer gas.

A description of embodiments of the present invention is given below, with reference to the FIG. 1 through FIG. 6.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
W: wafer;
2: mounting stage;
2a: base;
6: electrostatic chuck;
6c: conductive film;
6d: cylindrical member;
15: gas supply unit;
16: shower head;
21: mounting surface;
22: back surface;
31: heat transfer gas supply unit;
100: plasma processing apparatus;
210: gas supply pipe;
210a: through hole;
210b: through hole;
219: embedment member;
221: first embedment member;
221a: step;
221b: protrusion;
220: second embedment member; and
220a: cutout.

[Structure of Plasma Processing Apparatus]

Figure 1:
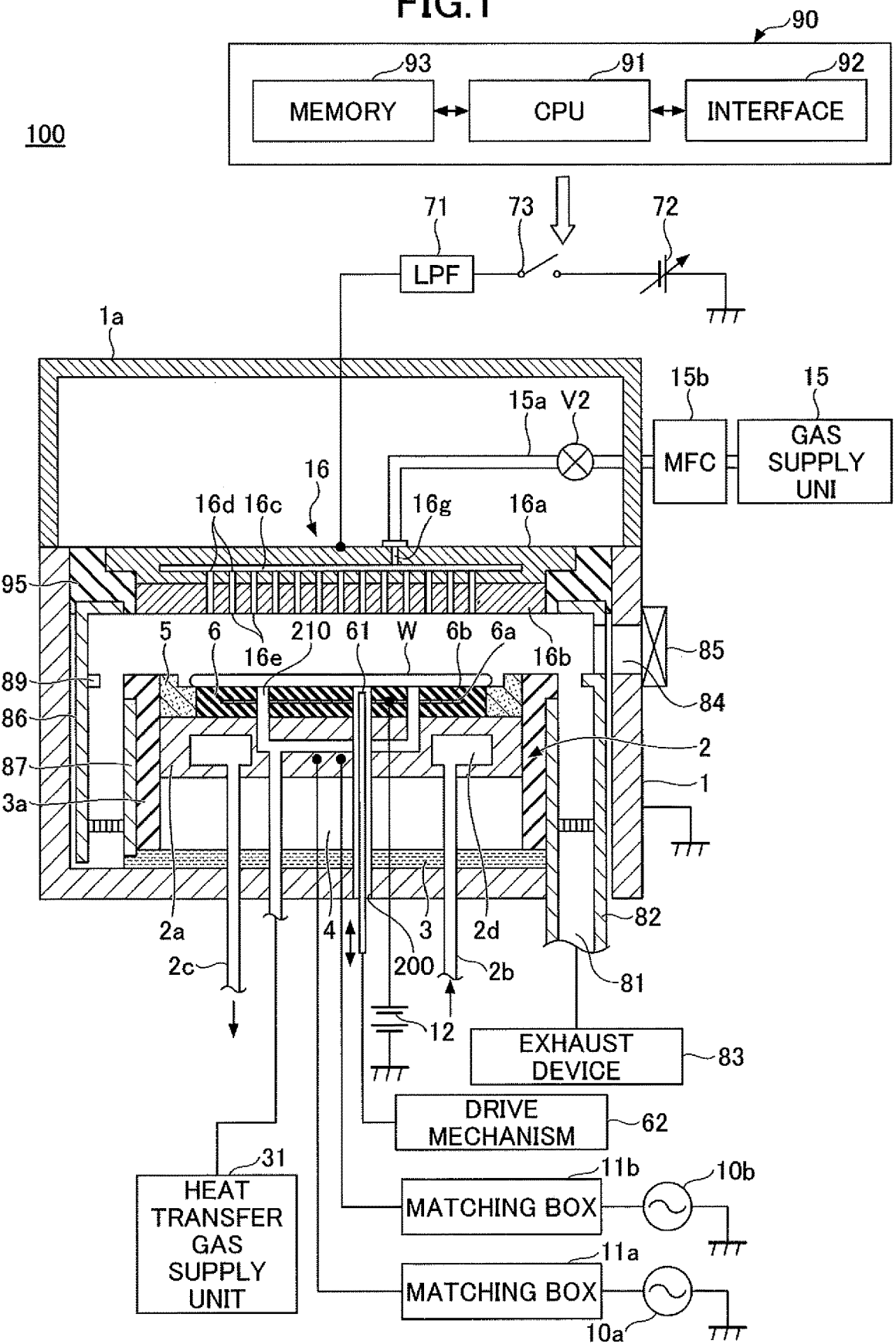
FIG. 1 illustrates an example of a plasma processing apparatus according to an embodiment of the present invention.

FIG. 1 illustrates an example of the structure of the plasma processing apparatus 100 of this embodiment. The plasma processing apparatus 100 includes a processing container 1 that is hermetically enclosed and electrically has the ground potential. This processing container 1 is in a cylindrical shape and is made from, for example, aluminum. The processing container 1 separates a space for generating plasma. Inside the processing container 1, the mounting stage 2 is provided to horizontally support a semiconductor wafer (hereinafter, referred to as a "wafer") as an object to be processed (work-piece). The mounting stage 2 includes a base 2a and an electrostatic chuck (ESC) 6. The base 2a is made from conductive metal such as aluminum and has a function as a lower electrode. An electrostatic chuck 6 is made from ceramics such as alumina and has a function of statistically adsorbing the wafer. The mounting stage 2 is supported by a support seat 4. The support seat 4 is supported by a support member 3 made from, for example, quartz. A focus ring 5 made from, for example, silicon is provided in an outer periphery above the mounting stage 2. Further, inside the processing container 1, a cylindrical inner wall member 3a made from, for example, quartz is provided so as to surround the outside of the mounting stage 2 and the support seat 4.

A first RF power source 10a is connected to the base 2a through the matching box 11a, and a second RF power source 10b is connected to the base 2a through the matching box 11b. The first RF power source 10a supplies high frequency power having a predetermined frequency for generating plasma to the base 2a of the mounting stage 2. The second RF power source 10b supplies high-frequency power having a predetermined frequency lower than that of the first RF power source 10a for drawing ions (for biasing) to the base 2a of the mounting stage 2.

A shower head having a function as the upper electrode is provided above the mounting stage 2 in parallel with the mounting stage 2. The shower head 16 and the mounting stage 2 function as a pair of electrodes (an upper electrode and a lower electrode).

The electrostatic chuck 6 is structured by embedding an electrode 6a in an insulator 6b. A direct current power source 12 is connected to the electrode 6a. When a direct voltage is applied from the direct current power source 12 to the electrode 6a to generate coulomb force, the wafer W is adsorbed by the coulomb force.

A refrigerant flow passage 2d is formed inside the mounting stage 2. A refrigerant inlet pipe 2b and a refrigerant outlet pipe 2c are connected to the refrigerant flow passage 2d. By circulating appropriate refrigerant such as cooling water inside a refrigerant flow passage 2d, the mounting stage 2 is controlled to have a predetermined temperature. A gas supply pipe 210 for supplying a cold and heat transferring gas (hereinafter, referred to as a "heat transfer gas") such as a helium gas is provided on the back surface of the wafer W through the mounting stage 2 or the like. The gas supply pipe a heat transfer gas supply unit 31. By this structure, the wafer W on the mounting stage 2 is controlled to have a predetermined temperature. The internal structure of the gas supply pipe 210 is described later.

The mounting stage 2 has multiple through holes 200 for multiple (for example, three) pins. Only one through hole is illustrated in FIG. 1. A lifter pin 61 is disposed inside each of the through holes 200. The lifter pin 61 is connected to a drive mechanism 62 so as to be moved up and down by the drive mechanism 62.

The gas shower head 16 is disposed in a ceiling portion of the processing container 1. The shower head 16 includes a main body 16a and an upper ceiling plate 16b as an electrode plate. The shower head 16 is supported by an upper portion of the processing container 1 via an insulation member 95. The main body 16a is made with aluminum whose surface is subjected to anodic oxidation, for example. The main body attachably and detachably supports a lower portion of the ceiling plate 16b.

An inside of the main body 16a includes a gas diffusion chamber 16c. A large number of gas communication holes 16d are formed in a bottom portion of the main body 16a so as to be positioned at a lower portion of the main body 16a. Gas introduction holes 16e penetrate the ceiling plate 16b in the thickness direction of the ceiling plate 16b. The gas introduction holes 16e respectively communicate with the above gas communication holes 16d.

A gas introducing port 16g for introducing a process gas into the gas diffusion chamber 16c is formed in the main body 16a. An end of a gas supply pipe 15a is connected to the gas introducing port 16g. A gas supply unit 15 for supplying a process gas is connected to another end of the gas supply pipe 15a. A mass flow controller (MFC) 15b and an on-off valve V2 are provided in the gas supply pipe 15a sequentially from the upstream side. The process gas is provided for plasma etching and is supplied from the gas supply unit 15 through the gas supply pipe 15a to the gas diffusion chamber 16c. By this structure, the process gas supplied to the gas diffusion chamber 16c is supplied inside the processing container 1 through the gas communication holes 16d and the gas introduction holes 16e.

A variable direct current power source 72 is electrically connected through a low pass filter (LPF) 71 to the shower head 16 as the above upper electrode. An on-off switch 73 turns on or off supply from the variable direct current power source 72. The electric current, the electric voltage, and on or off of the on-off switch 73 are controlled by the control unit 9. When plasma is generated in a process space by applying radio-frequency waves through the first RF power source 10a and the second RF power source 10b to the mounting stage 2, the control unit 90 turns on the on-off switch 73 so as to cause the shower head 16 to be applied with a predetermined direct voltage where necessary.

A cylindrical ground conductor 1a is disposed along the sidewall so as to extend over of the height of the shower head 16 in the upward direction. This cylindrical ground conductor 1a has a ceiling in it is upper portion.

An exhaust port 81 is formed in a bottom portion of the processing container 81. An exhaust device 83 is connected to the exhaust port 81 through an exhaust pipe 82. The exhaust device 83 includes a vacuum pump which is operated to depressurize the inside of the processing container 1 to be a predetermined degree of vacuum. A carry-in and carry-out port 84 for the wafer W is provided in a sidewall inside the processing container 1. A gate valve 85 for opening and closing the carry-in and carry-out port 84 is provided in the carry-in and carry-out port 84.

A depo-shield 86 is provided along an inner wall surface on a side of the processing container 1. The depo-shield 86 prevents an etching by-product (depo) from attaching to the processing container 1. At a position being substantially the same height as that of the wafer W in this depo-shield 86, a conductive member (a GND block) 89, to which an electric potential relative to the ground is connected so as to be controllable. With this, abnormal electrical discharge is prevented. A depo-shield 87 extends along the inner wall member 3a at a lower end of the depo-shield 86. The depo-shields 86 and 87 are attachable and detachable.

The operation of the above described plasma processing apparatus 100 is totally controlled by the control unit 90. The control unit 90 includes a CPU 91 controlling various portions of the plasma processing apparatus 100, an interface 92, and a memory 93.

The interface 92 includes a keyboard, with which a process administrator inputs commands for administering the plasma processing apparatus 100 and a display visualizing an operation state of the plasma processing apparatus 100 and displaying the visualized operation state.

The memory 93 stores a recipe, in which a control program (software) for implementing various processes performed by a control of the CPU 91, and a recipe storing data for processing conditions or the like are stored. By calling an arbitrary recipe from the memory 93 upon an instruction corresponding to an input operation from the interface 92 where necessary and causing the CPU 91 to execute, a desired process is performed by the plasma processing apparatus 100 under the control by the CPU 91. The control program and the recipe storing the data for processing conditions or the like can be used from a computer recording medium (for example, a hard disk, a CD, a flexible disk, a semiconductor memory, or the like) readable by the computer or can be used online through, for example, a dedicated line continuously transmitting the control program and the recipe.

[Structure of Mounting Stage]

Figure 2:
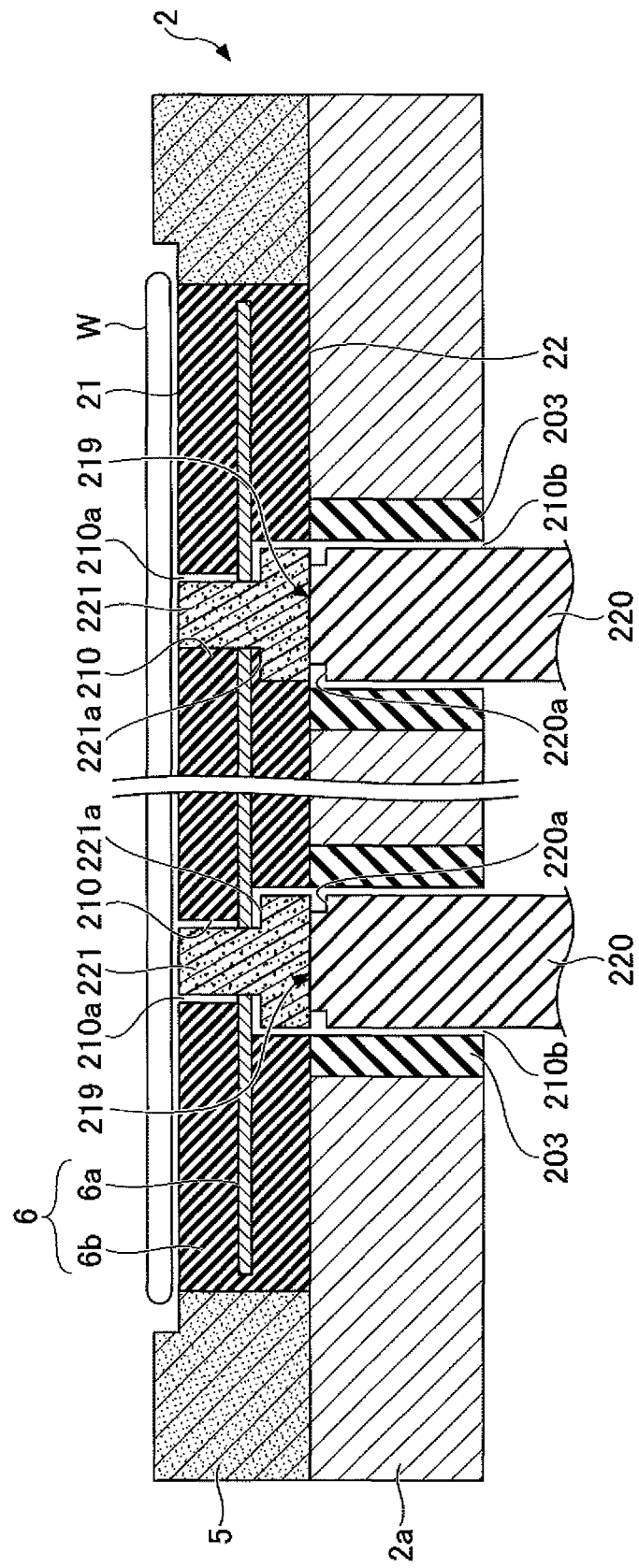
FIG. 2 is a cross-sectional view schematically illustrating a mounting stage according to an embodiment of the present invention.

Referring to FIG. 2, an example of the structure of the mounting stage 2 is described. FIG. 2 is a cross-sectional view schematically illustrating a mounting stage according to the embodiment of the present invention. The mounting stage 2 includes a base 2a and an electrostatic chuck 6. In the mounting stage 2, the electrostatic chuck 6 is shaped like a disk. The electrostatic chuck 6 has a mounting surface for mounting the wafer W similarly shaped like a disk and a back surface 22 facing the mounting surface 21. The base 2a is joined to the back surface 22 of the electrostatic chuck 6.

An end of the gas supply pipe 210 (a gas port) is formed on the mounting surface 21. The gas supply pipe 210 is formed with the through holes 210a and 210b and supplies a heat transfer gas such as a helium gas to the back surface of the wafer W. The through hole 210a is provided so as to penetrate from the back surface 22 of the electrostatic chuck 6 to the mounting surface 21. Said differently, the inner wall of the through hole 210a is formed by the electrostatic chuck 6. The through hole 210b is formed to penetrate through the back surface of the base 2a to a joint face between the base 2a and the electrostatic chuck 6. Said differently, the inner wall of the through hole 210b is formed by the base 2a.

The through hole 210a is an example of a first hole penetrating through the mounting surface 21 on which the wafer W is mounted and the back surface 22 opposite to the mounting surface 21. The through hole 210b is an example of a second hole formed in the base 2a and communicating with the first hole. The electrostatic chuck 6 is an example of a plate-like portion in which the first hole is formed. However, the plate-like portion, in which the first hole is formed, may not have the function of the electrostatic chuck 6.

The through hole 210a has a step. The inner diameter of the through hole above the step is smaller than the inner diameter of the through hole below the step. The inner diameter of the through hole 210b is equal to the the inner diameter of the through hole below the step. The through hole 210a and the through hole 210b are formed so as to be positionally aligned at, for example, a normal temperature. A gas sleeve made of alumina is provided in the gas supply pipe 210. A spacer may be provided on an inner wall of the gas supply pipe 210.

[Embedment Member]

An embedment member 219 is disposed inside the gas supply pipe 210. Specifically, a first embedment member 221 and a second embedment member 220 are respectively disposed inside the through hole 210a and the through hole 210b.

The thickness of the first embedment member 221 is the same as the thickness of the electrostatic chuck 6. The thickness of the first embedment member 221 may be thinner than the thickness of the electrostatic chuck 6. A step 221a is formed in the first embedment member 221. The outer diameter of the first embedment member 221 above the step 221a is smaller than the outer diameter of the first embedment member 221 below the step 221a. The longitudinal cross-sectional view of the first embedment member 221 is shaped like a protrusion.

The first embedment member 221 is formed by a material having plasma durability such as ceramics. For example, the first embedment member 221 may be made of any one of quartz, silicon carbide, silicon nitride, aluminum oxide, aluminum nitride, yttria, titanium oxide, and tungsten carbide. The first embedment member 221 is formed by a material having plasma durability such as ceramics. For example, the material having low plasma durability may be replaced by silicon, tungsten, titanium, silicone, Teflon ("Teflon" is a registered trademark), elastomer, or fluorine resin.

The second embedment member 220 is disposed below the first embedment member 221. The second embedment member 220 is made of, for example, alumina. A cutout 220a is formed in a peripheral edge of the upper end portion of the second embedment member 220. The cutout 220a is an example of a recess formed in the peripheral edge of the upper end portion of the second embedment member 220.

The outer diameter of the first embedment member 221 is smaller than the inner diameter of the through hole 210a. The outer diameter of the second embedment member 220 is smaller than the inner diameter of the through hole 210b. Therefore, the the first embedment member 221 and the second embedment member 220 are arranged to keep a predetermined interval from the inner wall of the gas supply pipe 210 to provide a heat transfer gas path inside the through holes 210a and 210b.

Further, in a case where the the first embedment member 221 is horizontally misaligned with the second embedment member 220, the cutout 220a in the upper end of the second embedment member 220 maintains the heat transfer gas path to enable the heat transfer gas to be sufficiently flown. However, when the width of the cutout 220a is unnecessarily large, there is a risk of generating abnormal electrical discharge. Therefore, the width of the cutout 220a is sufficient to enable the heat transfer gas to flow in the case where the first embedment member 221 and the second embedment member 220 are horizontally misaligned. Further, the cutout 220a may be formed through the entire periphery or shaped in a crescentic shape or a sector shape.

The high-frequency power applied to the mounting stage 2 in the plasma processing apparatus 100 has a higher voltage. When the high-frequency power applied to the mounting stage 2 has the higher voltage, abnormal electrical discharge may be generated near the through hole 210a.

Said differently, in the plasma processing apparatus 100, when the high-frequency power is applied to the mounting stage 2, an electric potential difference occurs between the wafer W and the back surface 22 of the electrostatic chuck 6 due to an electrostatic capacity of the electrostatic chuck 6. With this, if the electric potential difference of an RF electric potential generated in the through hole 210a exceeds a limit value, at which discharge is generated, abnormal electrical discharge occurs.

Meanwhile, it is experientially known that the abnormal electrical discharge is prevented from generating by shortening a straight travelling distance of charged particle of the heat transfer gas inside the through hole 210a. Within the embodiment, the embedment member 219 is disposed inside the gas supply pipe 210 to prevent the abnormal electrical discharge from occurring. Hereinafter, problems in the structure of comparative example are described, the structure of the embedment member 219 of the embodiment is described.

[Breakage of Embedment Member in Comparative Example]

Referring to FIG. 3, an example of breakage in the embedment member 300 of the comparative example is described. The embedment member 300 of the comparative example is arranged by providing a predetermined interval from the inner wall of the gas supply pipe 210.

The abnormal electrical discharge in the through hole 210*a* can be prevented by reducing the interval between the embedment member 300 and the through hole 210*a*. The abnormal electrical discharge in the through hole 210*a* can also be prevented by shortening the linear portion of the heat transfer gas path. This is because the energy of electrons in the heat transfer gas can be reduced. Then, as illustrated in the upper half of FIG. 3, the inner diameter of the through hole 210*b* is made greater than the inner diameter of the through hole 210*a*, and a portion of the embedment member 300 corresponding to the through hole 210*b* is made wider.

However, there may be a case where the embedment member 300 is broken. In a case where the plasma process is performed, the temperature of the mounting stage 2 become high, for example, 100° C. to 200° C. The electrostatic chuck 6 is made of ceramics and the base 2*a* is made of metal. The electrostatic chuck 6 and the base 2*a* have different thermal expansion coefficients. Therefore, if the temperature of the electrostatic chuck 6 and the base 2*a* become high, the through holes 210*a* and 210*b* are misaligned as illustrated in the lower half of FIG. 3 due to differential thermal expansion between the electrostatic chuck 6 and the base 2*a*. In this case, the shear stress is applied to the embedment member 300 from the base 2*a*. As a result, there may occur a case where a part corresponding to the through hole 210*a* of the embedment member 300 contacts the electrostatic chuck 6 and the embedment member 300 breaks.

[Embedment Member of this Embodiment]
(Prevention of Breakage of Embedment Member)

As illustrated in the upper half of FIG. 4, the embedment member 219 of the embodiment is structured such that the first embedment member 221 disposed on the second embedment member 220 is not fixed to the second embedment member 220 to prevent breakage by the thermal expansion. With this structure, as illustrated in the lower half of FIG. 4, in a case where the positions of the through holes 210*a* and 210*b* are misaligned due to the thermal expansion, shear stress is applied to the embedment member 219 from the base 2*a*. In this case, according to the embodiment, the embedment member 219 is prevented from being broken because the second embedment member 220 is misaligned relative to the first embedment member 221.

The cutout 220*a* of the second embedment member 220 maintains the heat transfer gas path inside the gas supply pipe 210 even if the first embedment member 221 and the second embedment member 220 are misaligned. With this, it is possible to sufficiently supply the heat transfer gas to the back surface of the wafer W.

(Prevention of Spread of Embedment Member)

When the inside of the processing container 1 is evacuated to vacuum by the exhaust device 83, the inside of the gas supply pipe 210 having the embedment member 219 is also evacuated onto a side of a process space. If the wafer W is not mounted on the electrostatic chuck 6 at that time, because the first embedment member 221 is not fixed to the second embedment member 220, there a risk that the first embedment member 221 flies out through the hole 210*a* into the process space above the electrostatic chuck 6.

The first embedment member 221 includes a step 221*a*. The outer diameter below the step 221*a* is greater than the outer diameter above the step 221*a*. With this, it is possible to prevent the first embedment member 221 from spreading inside the process space in a case where the inside of the processing container 1 is evacuated to vacuum or the heat transfer gas is supplied to the back surface of the wafer W.

The first embedment member 221 is not limited to the protrusion-like shape, and may be in a shape such that a portion wider than that in the upper end portion of the first embedment member 221 on a lower side. According to such a shape, the first embedment member 221 can be prevented from flying out of the gas supply pipe 210.

[Manufacturing Method of Mounting Stage]

Figure 5A:
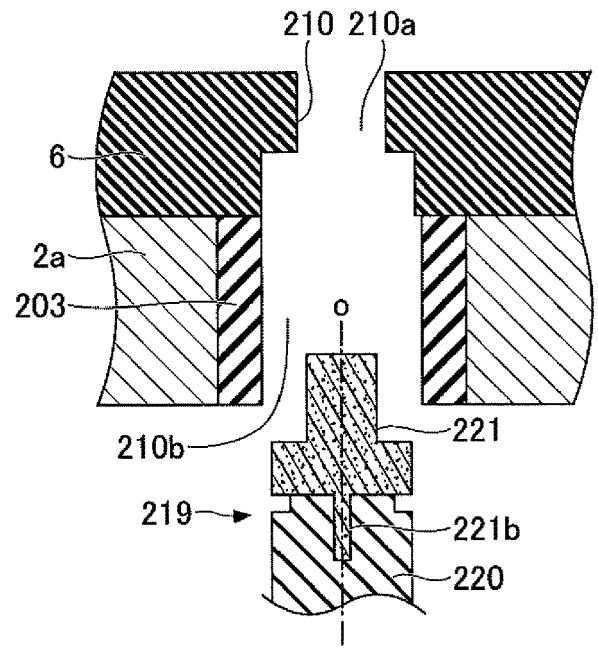
FIGS. 5A to 5C illustrate an example of a method for manufacturing a mounting stage according to the embodiment of the present invention.
Figure 5B:
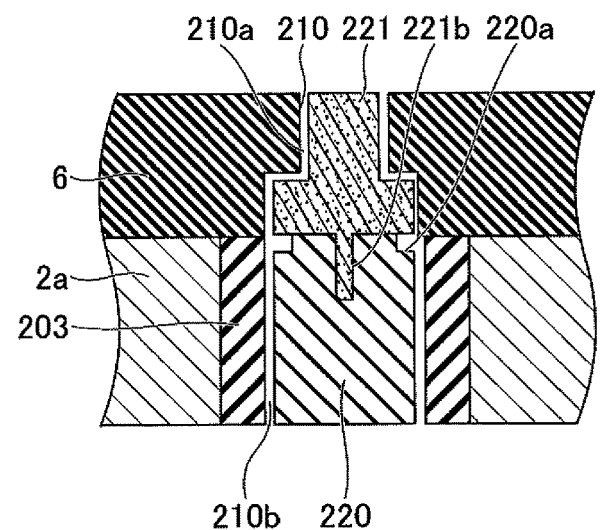
Figure 5C:
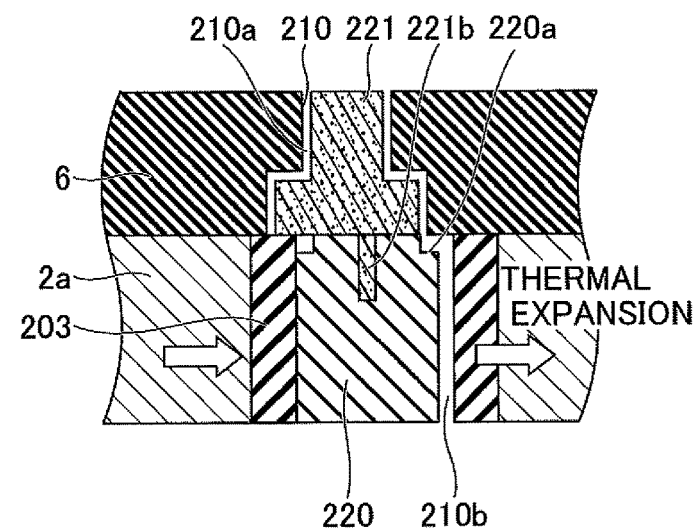

Next, referring to FIGS. 5A to 5C, an example of the manufacturing method of the embodiment is described. FIGS. 5A to 5C illustrate examples of the manufacturing method for manufacturing the mounting stage 2 of this embodiment. According to the manufacturing method, as illustrated in FIG. 5A, the gas supply pipe 210 penetrating through the mounting stage 2 is formed after registering the positions of the through hole 210*a* penetrating the electrostatic chuck 6 and the through hole 210*b* penetrating through the base 2*a*. The number of the gas supply pipes 210 provided at predetermined positions of the mounting stage 2 is about 12 to 18 pieces. The through hole 210*b* is formed by disposing a sleeve for gas 203 made of alumina.

Within the embodiment, a rod-like protrusion 221*b* protruding on a lower side is formed at the lower end portion of the first embedment member 221. The embedment member 219 formed by fitting the protrusion 221*b* into a recess formed at the upper end of the second embedment member 220 is prepared. The first embedment member 22 of this embodiment is separate from the second embedment member 220. Therefore, according to this manufacturing method of the embedment member 219, the protrusion 221*b* formed at the lower end of the first embedment member 221 is used to register the first embedment member 221 and the second embedment member 220 so that center lines o of the first embedment member 221 and the second embedment member 220 match.

Next, as illustrated in FIG. 5B, the embedment member 219 is inserted in the through hole 210*a* and the through hole 210*b*. The embedment member 219 is disposed inside the gas supply pipe 210 so that a predetermined space as the heat transfer gas path is formed between embedment member 219 and the through hole 210*a* and 210*b*. With this, the first embedment member 221 is disposed inside the through hole 210*a* and the second embedment member 220 is disposed inside the through hole 210*b*.

As described, the temperature of the mounting stage 2 is high such as 100° C. to 200° C. When the temperature of the mounting stage 2 becomes high, the positions of the through hole 210*a* and the through hole 210*b* are misaligned due to a differential thermal coefficient between the electrostatic chuck 6 and the base 2*a*.

In this case, when shear stress is applied to the embedment member 219 from the base 2*a*, the second embedment member 220 is misaligned from the first embedment member 221 so that the protrusion 221*b* is divided from the first embedment member 221. As a result, as illustrated in FIG. 5C, the first embedment member 221 and the second embedment member 220 are not mutually fixed. With this structure, according to the manufacturing method of the mounting stage 2 of the embodiment, the mounting stage 2 can be manufactures so that the embedment member 219 does not break due to the misalignment of the positions of the through hole 210*a* and the through hole 210*b*.

Although, according to this manufacturing method, the example where the protrusion 221*b* is divided from the first embedment member 221 is described, the embodiment is not limited thereto. For example, the protrusion 221*b* may not be divided from the first embedment member 221. The protrusion 221*b* may be made of soft material such as a resin so as to deform depending on the misalignment of the positions of the through holes 210*a* and 210*b*. With this, the mounting stage 2 may be manufactured so that the embedment member 219 does not break.

Further, it is sufficient that the protrusion 221*b* can register the first embedment member 221 and the second embedment member 220 and can provisionally fix at the time of manufacture. One or multiple protrusions may be provided at any position on the lower surface of the first embedment member 221. Furthermore, the protrusion 221*b* is not limited to a rod-like shape but a screw-like shape.

[Modified Example]

Figure 6A:
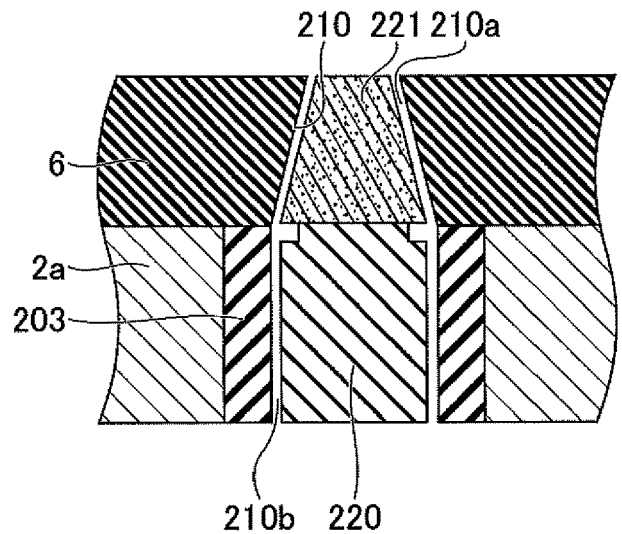
FIGS. 6A to 6C illustrate a modified example of a first embedment member according to the embodiment of the present invention.
Figure 6B:
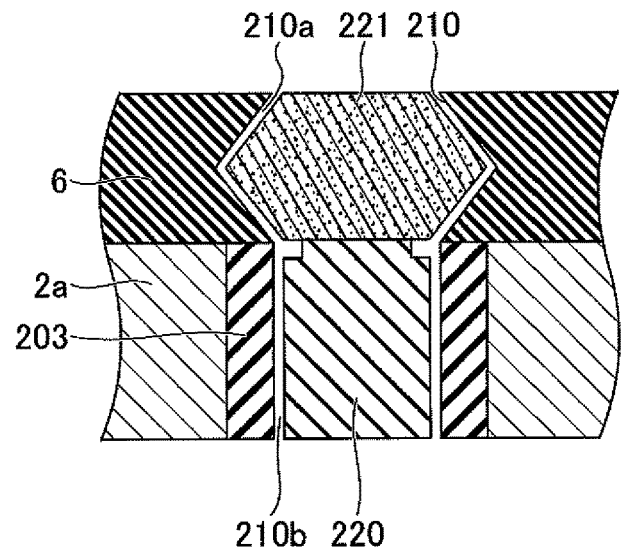
Figure 6C:
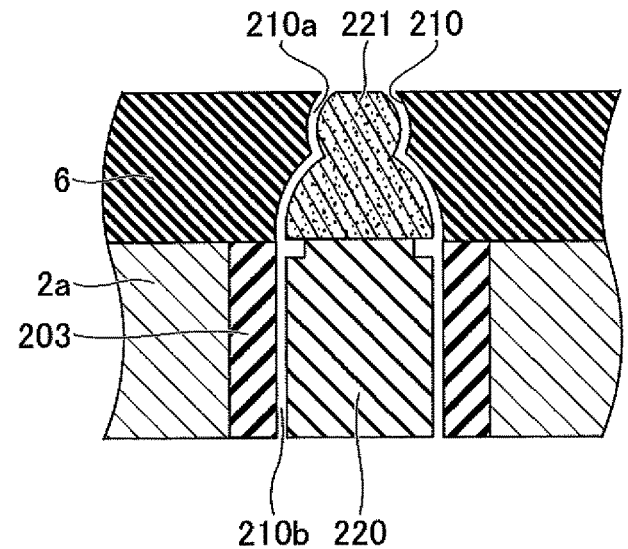

Finally, referring to FIGS. 6A to 6C, a modified example of the first embedment member 221 is described. FIGS. 6A thru 6C illustrate a modified example of a first embedment member 221 according to the embodiment of the present invention. The first embedment member is in any one of a shape of a protrusion, a shape where a width of a portion increases as the portion approaches a lower end, a shape where a portion having a widest width is positioned between an upper end and the lower end, and a shape where a portion having a narrowest width is positioned between the upper end and the lower end (a shape of a gourd whose upper end and lower end are flat).

FIG. 6A illustrates an example of a shape where the width of a portion increases as the portion approaches the lower end. The shape of the first embedment member 221 is a conic shape, and a longitudinal cross-sectional view of the first embedment member 221 is substantially a triangle (the upper end is flat).

FIG. 6B illustrates an example of a shape where a portion having the widest width is positioned between the upper end and the lower end. The shape of the longitudinal cross-sectional view of the first embedment member 221 is substantially a rhombus (the upper and lower ends are flat).

FIG. 6C illustrates an example of a shape where a portion having a dent is positioned between the upper end and the lower end. The shape of the longitudinal cross-sectional view of the first embedment member 221 is substantially a gourd.

Referring to FIGS. 6A to 6C, the examples of the first embedment member 221 are in the shape where the portion having the widest width is positioned between the upper end and the lower end. The shape of the first embedment member 221 is not limited as long as the portion having a width wider than the width of the upper end on a side lower than the upper end.

The plasma processing apparatus 100 may be a plasma processing apparatus having the mounting stage 2 manufactured by the manufacturing method illustrated in FIG. 5. According to the manufacturing method for manufacturing the plasma processing apparatus 100 and the mounting stage 2, the first embedment member 221 does not fly apart and the embedment member 219 can be prevented from breaking.

Further, by disposing the embedment member 219 inside the gas supply pipe 210, the heat transfer gas is sufficiently supplied to the back surface of the wafer W, and simultaneously it is possible to prevent abnormal electrical discharge from occurring in the through hole 210*a* by electric power of a high frequency applied to the base 2*a*.

The plasma processing apparatus of the embodiments may be any type of Capacitively Coupled Plasma (CCP), Inductively Coupled Plasma (ICP), Radial Line Slot Antenna, Electron Cyclotron Resonance Plasma (ECR), and Helicon Wave Plasma (HWP).

Within the embodiment, the wafer W is mentioned as an example of an object to be processed by the plasma processing apparatus. However, the object to be processed is not limited to this and may be various substrates used for a Liquid Crystal Display (LCD) and a Flat Panel Display (FPD), a Compact Disk (CD) substrate, a printed wiring board, and so on.

According to the embodiment, it is possible to provide an embedment member which can prevent abnormal electrical discharge from occurring in the hole of the heat transfer gas.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the method for manufacturing the plasma processing apparatus and the mounting stage of the present invention have been described in detail, it should be understood that the various changes, substitutions, and alterations could be made hereto without departing from the spirit and scope of the invention.

What is claimed is:

1. A plasma processing apparatus comprising:
 a mounting stage including
  a plate-like member,
   which has a mounting surface, on which an object to be processed is mounted, and a back surface provided on a side opposite to the mounting surface, and
   in which a first hole penetrating through the mounting surface and the back surface is formed, and
  a base
   which has a supporting surface supporting the plate-like member, the back surface of the plate-like member and the supporting surface of the base forming a joint face, and
   in which a second hole penetrating through the supporting surface and communicating with the first hole is formed; and
  an embedment member disposed inside the first hole and the second hole and including a first embedment member disposed inside the first hole and a second embedment member disposed inside the second hole,
 wherein the first embedment member and the second embedment member are not mutually fixed at an interfacial boundary between a part of the first hole formed on the back surface of the plate-like member and a part of the second hole formed on the supporting surface of the base,
 wherein the first embedment member has a portion having a wider width at a lower end than an upper end,
 wherein an entirety of the portion having the wider width at the lower end of the first embedment member is positioned above a horizontally upper end surface of the second embedment member,
 wherein the first embedment member has a diameter that is smaller than a diameter of the first hole and the second embedment member has a diameter that is smaller than a diameter of the second hole so that a heat transfer gas path is formed between an outer peripheral surface of the first embedment member and an inner wall of the first hole and between an outer peripheral surface of the second embedment member and an inner wall of the second hole, wherein the first embedment member and the inner wall of the first hole form a first interval that penetrates from the mounting surface and the back surface of the plate-like member, wherein the second embedment member and the inner wall of the second hole form a second interval that penetrates from the supporting surface and a second back surface of the base, wherein a recess is formed at a peripheral edge of an upper end portion of the second embedment member, and wherein the recess is formed so that the heat transfer gas path is maintained while the first embedment member and the second embedment member are horizontally misaligned.

2. The plasma processing apparatus according to claim 1, wherein a thickness of the first embedment member is equal to or smaller than a thickness of the plate-like member.

3. The plasma processing apparatus, according to claim 1, wherein the first embedment member is in any one of a shape of a protrusion, a shape where a width of a portion increases as the portion approaches a lower end, a shape where a portion having a widest width is positioned between an upper end and the lower end, and a shape where a portion having a narrowest width is positioned between the upper end and the lower end.

4. A method for manufacturing a mounting stage comprising:
preparing an embedment member including a first embedment member and a second embedment member and formed by fitting a protrusion formed in a lower end of the first embedment member, which has an intervening portion having a wider width at a lower end than an upper end into a recess formed in a horizontally upper end surface of the second embedment member so that an entirety of the intervening portion having the wider width at the lower end of the first embedment member is positioned above the horizontally upper end surface of the second embedment member,
inserting the embedment member into a mounting stage, the mounting stage including
a plate-like member,
which has a mounting surface, on which an object to be processed is mounted, and a back surface provided on a side opposite to the mounting surface, and
in which a first hole penetrating through the mounting surface and the back surface is formed, and
a base
which has a supporting surface supporting the plate-like member, said the back surface of the plate-like member and the supporting surface of the base forming a joint face, and
in which a second hole penetrating through the supporting surface and communicating with the first hole is formed;
disposing the embedment member into an inside of the first and second holes so as to provide a heat transfer gas path inside the first and second holes; and
dividing the protrusion from the first embedment member using stress applied from the mounting stage after disposing the embedment member so as to make the first embedment member and the second embedment member not mutually fixed at an interfacial boundary between the back surface of the plate-like member and the supporting surface of the base, said method further comprises:
arranging the first embedment member and an inner wall of the first hole so as to form a first interval that penetrates from the mounting surface and the back surface of the plate-like member,
arranging the second embedment member and an inner wall of the second hole so as to form a second interval that penetrates from the supporting surface and a second back surface of the base, and
forming a recess at a peripheral edge of an upper end portion of the second embedment member,
wherein the recess is formed so that the heat transfer gas path is maintained while the first embedment member and the second embedment member are horizontally misaligned.

5. A plasma processing apparatus comprising
a mounting stage manufactured by:
preparing an embedment member including a first embedment member and a second embedment member and formed by fitting a protrusion formed in a lower end of the first embedment member, which has an intervening portion having a wider width at a lower end than an upper end into a recess formed in a horizontally upper end surface of the second embedment member so that an entirety of the intervening portion having the wider width at the lower end of the first embedment member is positioned above the horizontally upper end surface of the second embedment member;
inserting the embedment member into a mounting stage, the mounting stage including
a plate-like member,
which has a mounting surface, on which an object to be processed is mounted, and a back surface provided on a side opposite to the mounting surface, and
in which a first hole penetrating through the mounting surface and the back surface is formed, and
a base
which has a supporting surface supporting the plate-like member, said the back surface of the plate-like member and the supporting surface of the base forming a joint face, and
in which a second hole penetrating through the supporting surface and communicating with the first hole is formed;
disposing the embedment member into an inside of the first and second holes so as to provide a heat transfer gas path inside the first and second holes; and
dividing the protrusion from the first embedment member using stress applied from the mounting stage after disposing the embedment member so as to make the first embedment member and the second embedment member not mutually fixed at an interfacial boundary between the back surface of the plate-like member and the supporting surface of the base, wherein the first embedment member and an inner wall of the first hole form a first interval that penetrates from the mounting surface and the back surface of the plate-like member, wherein the second embedment member and an inner wall of the second hole form a second interval that penetrates from the supporting surface and a second back surface of the base, wherein a recess is formed at a peripheral edge of an upper end portion of the second embedment member, and wherein the recess is formed so that the heat transfer gas path is maintained while the first embedment member and the second embedment member are horizontally misaligned.

6. The plasma processing apparatus according to claim 1, wherein a maximum outer width of the first embedment member is substantially same as a maximum outer width of the second embedment member, respectively.

7. The plasma processing apparatus according to claim 1, wherein a maximum inner width of the first hole is substantially same as a maximum inner width of the second hole, respectively.

8. The method for manufacturing the mounting stage according to claim 6, wherein a maximum outer width of the first embedment member is substantially same as a maximum outer width of the second embedment member, respectively.

9. The method for manufacturing the mounting stage according to claim 6, wherein a maximum inner width of the first hole is substantially same as a maximum inner width of the second hole, respectively.

10. The plasma processing apparatus according to claim 5, wherein a maximum outer width of the first embedment member is substantially same as a maximum outer width of the second embedment member, respectively.

11. The plasma processing apparatus according to claim 5, wherein a maximum inner width of the first hole is substantially same as a maximum inner width of the second hole, respectively.

12. The plasma processing apparatus according to claim 1, wherein an entirety of an interface caused by contacting between the first embedment member and the second embedment member and an entirety of the joint face are laid out solely on one flat surface.

13. The plasma processing apparatus according to claim 1, wherein the first embedment member and the second embedment member have substantially same maximum widths.

14. The method for manufacturing the mounting stage according to claim 6, wherein the first embedment member and the second embedment member are formed to have substantially same maximum widths.

15. The plasma processing apparatus according to claim 5, wherein the first embedment member and the second embedment member have substantially same maximum widths.

16. The plasma processing apparatus according to claim 1, wherein the first hole and the second hole have substantially same maximum widths.

17. The method for manufacturing the mounting stage according to claim 6, wherein the first hole and the second hole are formed to have substantially same maximum widths.

18. The plasma processing apparatus according to claim 5, wherein the first hole and the second hole have substantially same maximum widths.

19. The plasma processing apparatus according to claim 1, wherein the first embedment member and the second embedment member are in contact with each other on a plane which is positioned at a same level as the joint face in a thickness direction of the mounting stage.

* * * * *